United States Patent
Qiao et al.

(10) Patent No.: US 11,929,663 B2
(45) Date of Patent: Mar. 12, 2024

(54) POWER MANAGEMENT INTEGRATED CIRCUIT WITH CHARGE PUMP

(71) Applicant: Renesas Electronics America Inc., Milpitas, CA (US)

(72) Inventors: Juan Qiao, San Jose, CA (US); Chenxiao Ren, Fremont, CA (US); Yue Wang, San Jose, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 189 days.

(21) Appl. No.: 17/527,661

(22) Filed: Nov. 16, 2021

(65) Prior Publication Data

US 2023/0012015 A1    Jan. 12, 2023

Related U.S. Application Data

(60) Provisional application No. 63/219,990, filed on Jul. 9, 2021.

(51) Int. Cl.
*G11C 11/4074* (2006.01)
*H02M 1/00* (2006.01)
*H02M 3/07* (2006.01)

(52) U.S. Cl.
CPC ....... *H02M 1/0045* (2021.05); *G11C 11/4074* (2013.01); *H02M 3/07* (2013.01)

(58) Field of Classification Search
CPC ........... G11C 5/14; G11C 5/145; G11C 5/147; G11C 5/146; G11C 11/4074; H02M 3/07; H02M 1/0045
See application file for complete search history.

(56) References Cited

U.S. PATENT DOCUMENTS

| | | | |
|---|---|---|---|
| 6,300,820 B1 * | 10/2001 | Fotouhi | H02M 3/07 327/536 |
| 2019/0340142 A1 * | 11/2019 | Patel | G06M 13/24 |

* cited by examiner

*Primary Examiner* — Alfredo Bermudez Lozada
(74) *Attorney, Agent, or Firm* — SCULLY, SCOTT, MURPHY & PRESSER, P.C.

(57) ABSTRACT

In an embodiment, an apparatus is disclosed that includes a power management integrated circuit (PMIC). The PMIC includes a voltage regulator supplied by a first power source and configured to generate a first output and a charge pump supplied by a second power source and configured to generate a second output. A bias voltage output of the power management integrated circuit is generated based at least in part on the first output and the second output. The charge pump is configured to adjust the second output based at least in part on a comparison between the bias voltage output and a reference voltage.

19 Claims, 7 Drawing Sheets

POWER MANAGEMENT INTEGRATED CIRCUIT WITH CHARGE PUMP

CROSS-REFERENCE TO RELATED APPLICATIONS

This application claims the benefit of U.S. Provisional Application No. 63/219,990 filed on Jul. 9, 2021, the entire content of the provisional application is incorporated herein by reference.

BACKGROUND OF THE SPECIFICATION

The present disclosure relates to memory. More specifically, the present disclosure relates in some embodiments to voltage regulation in a power management integrated circuit (PMIC) of a double data-rate (DDR) random access memory (RAM) module.

Power consumption and efficiency is increasingly important in both fixed and portable computing devices to reduce power costs and ensure a long battery life. Portable computing devices, such as, e.g., laptops, notebooks, netbooks, or other computing devices that may need to rely on battery power, often have stringent requirements for power consumption and efficiency. In such computing devices, each component typically needs to be optimized to reduce power consumption.

SUMMARY

In an embodiment, an apparatus is disclosed that comprises a power management integrated circuit (PMIC). The PMIC comprises a voltage regulator supplied by a first power source and configured to generate a first output and a charge pump supplied by a second power source and configured to generate a second output. A bias voltage output of the power management integrated circuit is generated based at least in part on the first output and the second output. The charge pump is configured to adjust the second output based at least in part on a comparison between the bias voltage output and a reference voltage.

In another embodiment, a memory module is disclosed that comprises a power management integrated circuit supplied by a first power source and a second power source and configured to output a bias voltage output. The power management integrated circuit comprises a charge pump supplied by the second power source and configured to generate a charge pump voltage output. The bias voltage output of the power management integrated circuit is generated based at least in part on the charge pump voltage output. The charge pump is configured to adjust the charge pump voltage output based at least in part on a comparison between the bias voltage output and a reference voltage.

In another embodiment, an apparatus is disclosed that comprises a first capacitor that is configured to alternately charge from a power source based at least in part on a first portion of a clock signal and to discharge to a bias voltage output of a power management integrated circuit based at least in part on a second portion of the clock signal. The apparatus further comprises a second capacitor that is configured to alternately charge from the power source based at least in part on the second portion of the clock signal and to discharge to the bias voltage output of the power management integrated circuit based at least in part on the second portion of the clock signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Power management in DDR random access memory (RAM) modules often relies on the use of a power management integrated circuit (PMIC) to handle the conversion of a bulk power input to one or more power outputs having voltages that correspond to the requirements for different components of the DDR memory module, and in some embodiments, a DDR fifth generation (DDR5) memory module. In one example, the disclosed embodiments may comprise unbuffered dual inline memory modules (UDIMM). For example, for a notebook computer, the disclosed embodiments may comprise small outline dual in-line memory modules (SODIMM) such as, e.g., DDR5 SODIMM. In another example, the disclosed embodiments may comprise registered dual inline memory modules (RDIMM). The disclosed embodiments may alternatively comprise any type of memory module.

Figure 1:
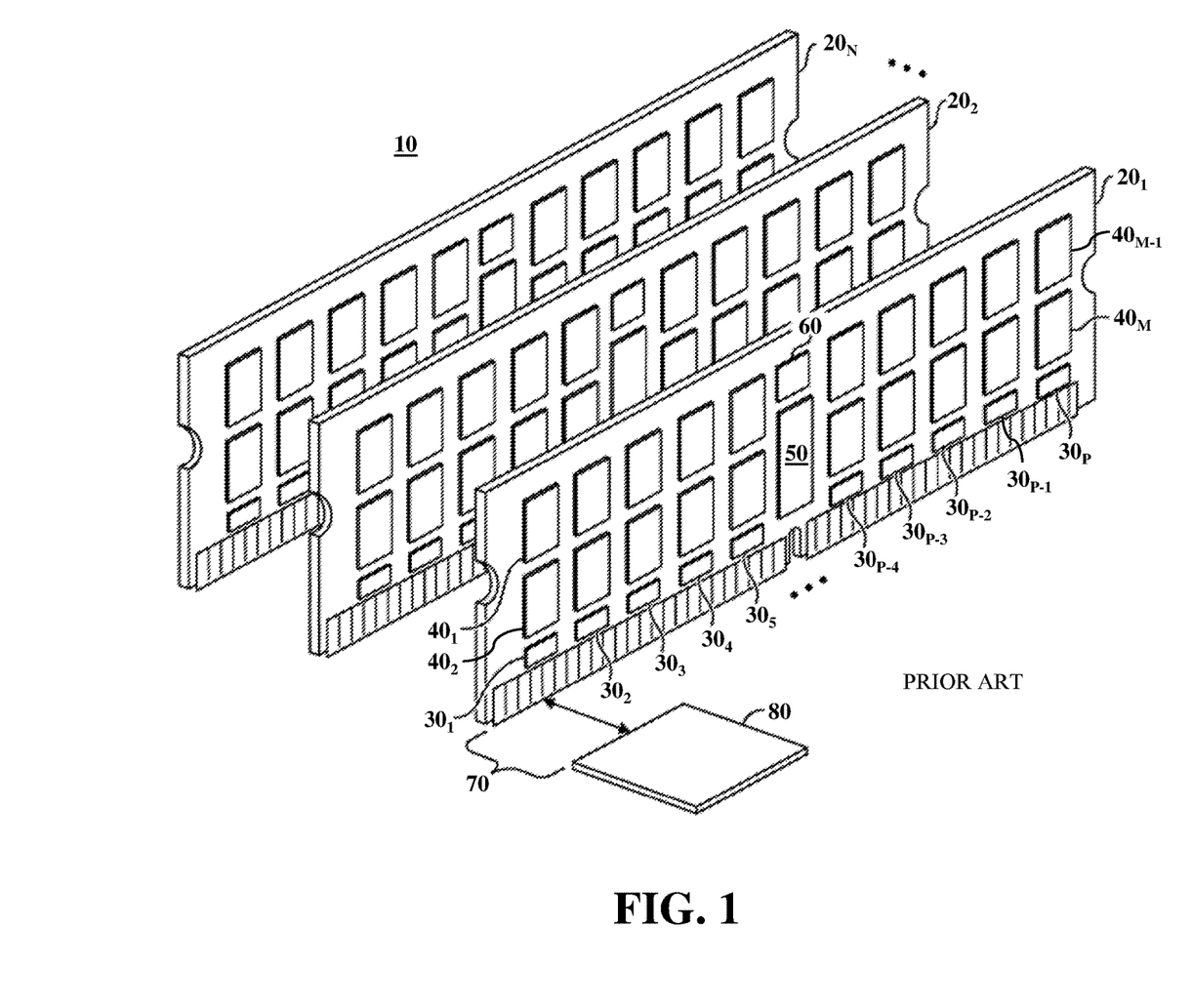
FIG. 1 is a diagram of an example memory system according to an embodiment of the disclosure.
Figure 2:
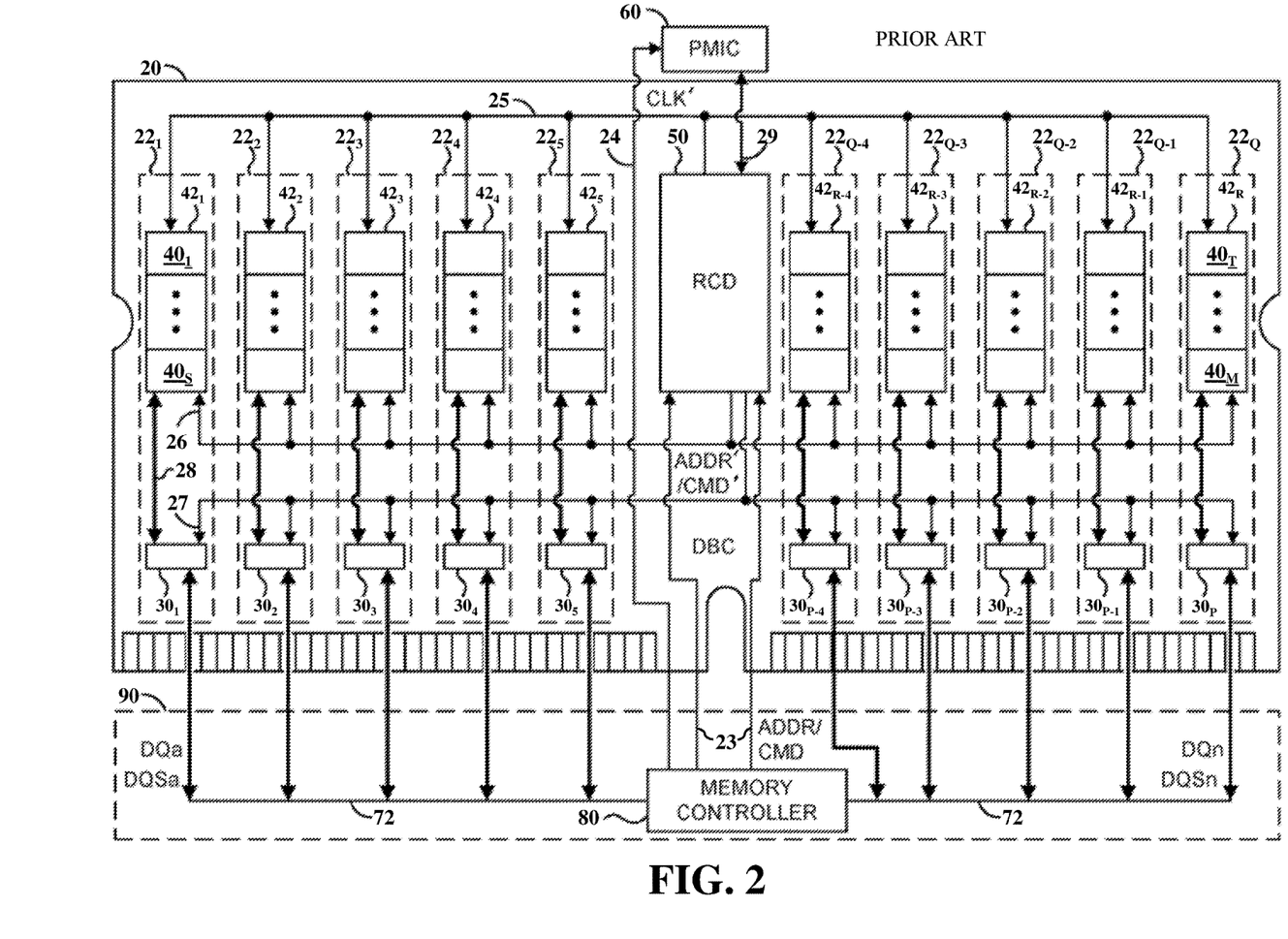
FIG. 2 is a block diagram illustrating an example memory module of the memory system of FIG. 1 according to an embodiment of the disclosure.

FIGS. 1 and 2 illustrate an example embodiment of a memory system 10. The memory system 10 includes memory modules $20_1$, $20_2$ ... $20_N$, also referred to herein collectively or individually as memory module(s) 20, connectors 70 and a memory controller 80.

With reference to FIG. 1, in one example embodiment, the memory modules 20 may comprise dual in-line memory modules (DIMMs). In some embodiments, the memory modules 20 may be implemented as double data rate fifth generation (DDR5) SDRAM modules. While described and illustrated herein as having a particular type, arrangement and number of components, in other embodiments, memory modules 20 may comprise any other type, arrangement or number of components.

An example memory module 20 comprises circuitry blocks $30_1$, $30_2$, $30_3$, $30_4$, $30_5$ ... $30_{P-4}$, $30_{P-3}$, $30_{P-2}$, $30_{P-1}$ and $30_P$, circuitry blocks $40_1$, $40_2$, ... $40_{M-1}$ and $40_M$, a registered clock driver (RCD) 50, a PMIC 60, connectors 70 and any other blocks, circuits, pins, connectors, traces or other component typically found in a memory module. In some embodiments, circuitry blocks $30_1$, $30_2$, $30_3$, $30_4$, $30_5 \ldots 30_{P-4}$, $30_{P-3}$, $30_{P-2}$, $30_{P-1}$ and $30_P$ may be configured as data buffers and will also be referred to herein collectively or individually as data buffers(s) 30. In some embodiments, circuitry blocks $40_1$, $40_2$, . . . $40_{M-1}$ and $40_M$ may be configured as memory devices and will also be referred to herein collectively or individually as memory device(s) 40. While described herein as data buffers 30 and memory devices 40, circuitry blocks 30 and 40 may also or alternatively be utilized for any other purpose by the memory modules 20.

In some embodiments, data buffers 30 and memory devices 40 comprise synchronous dynamic random-access memory (SDRAM) devices, chips or modules. In some embodiments, data buffers 30 and memory devices 40 also or alternatively comprise any other types of memory devices such as, e.g., SRAM, DRAM, MROM, PROM, EPROM and EEPROM. The data buffers 30, memory devices 40 or both may be physically located on one side or both sides (e.g., the front and back) of the memory module 20.

PMIC 60 is configured to perform power management for the memory module 20. For example, the PMIC 60 may be configured to scale up or scale down voltages, perform DC-DC conversions or perform other similar power management operations. In some embodiments, PMIC 60 may comprise low-dropout regulators (LDOs), DC-DC converters such as, e.g., buck or boost converters, pulse-frequency modulation (PFM), pulse-width modulation (PWM), power field-effect transistors (FETs), real-time clocks (RTCs) or any other circuitry that may typically be found in a PMIC.

Connectors 70 may comprise, for example, pins, traces or other connections that are configured to connect the memory modules 20 to other components of a computing system such as, e.g., a memory controller 80, motherboard, or other components. In some embodiments, the connectors 70 may comprise, e.g., a 288-pin configuration or any other pin configuration.

In some embodiments, the memory module 20 comprises the connectors 70. In other embodiments, a motherboard, memory controller 80 or any other component of a computing device comprises the connectors 70. In another embodiment, one or more of the connectors 70 may be part of the memory module 20 and one or more of the connectors 70 may be part of the motherboard, memory controller 80 or other component of the computing device.

The memory modules 20 may be connected to the motherboard, memory controller 80 or other component of the computing device, e.g., by connectors 70, to transfer data between components of the computing device and the memory modules 20. For example, in an embodiment that implements a UDIMM, the connectors 70 may comprise a 64-bit bus, a 72-bit bus or a bus comprising any other number of bits.

The memory modules 20 are shown connected to the memory controller 80 of the computing device. In an example embodiment, the memory controller 80 may be implemented as a component of a computer motherboard, or main board, of the computing device, e.g., on a northbridge of the motherboard. In another example, the memory controller 80 may be implemented as a component of a microprocessor of the computing device. In yet another example, the memory controller 80 may be implemented as a component of a central processing unit (CPU) of the computing device. In other embodiments, the memory controller 80 may be implemented as a part of any other component of the computing device.

In some embodiments, the memory modules 20 are implemented as DDR5 SDRAM memory modules. As an example, the memory modules 20 may comprise a memory module density of 128 gigabyte (GB), 512 GB, one terabyte (TB), or higher per module. Memory modules 20 may operate with a frequency of about 1.2 to about 3.2 giga-Hertz (GHz) and a data rate range of about 3.2 GT/s to about 4.6 GT/s and in some cases a data rate up to about 8 GT/s or more. In some embodiments, the memory modules 20 may alternatively comprise smaller or larger densities, operate at lower or higher frequencies and operate at lower or higher data rates.

With reference now to FIG. 2, a block diagram illustrating an example memory module 20 of FIG. 1 is shown. The memory module 20 may be representative of the memory modules 20A-20N. The memory module 20 is shown communicating with the memory controller 80. The memory controller 80 is shown as part of a circuit 90 such as, e.g., a motherboard, main board or other component of a computing device that communicates with the memory module 20.

The memory module 20 comprises one or more groupings of circuits $22_1$, $22_2$, $22_3$, $22_4$, $22_5 \ldots 22_{Q-4}$, $22_{Q-3}$, $22_{Q-2}$, $22_{Q-1}$ and $22_Q$, also referred to herein collectively or individually as data paths 22 of the memory module 20. In the example shown, the memory module 20 may comprise five data paths 22, e.g., data paths $22_1$, $22_2$, $22_3$, $22_4$ and $22_5$, on one side of the RCD 50 and five data paths 22, e.g., data paths $22_{Q-4}$, $22_{Q-3}$, $22_{Q-2}$, $22_{Q-1}$ and $22_Q$, on the other side of the RCD 50. In other embodiments, memory module 20 may comprise other arrangements having a greater or smaller number of data paths 22 on each side of the RCD 50.

The data paths 22 may each comprise a respective memory channel $42_1$, $42_2$, $42_3$, $42_4$, $42_5 \ldots 42_{R-4}$, $42_{R-3}$, $42_{R-2}$, $42_{R-1}$ and $42_R$, also referred to herein collectively and individually as memory channel(s) 42. Each memory channel 42 may comprise one or more of the memory devices 40. For example, memory channel $42_1$ may comprise memory devices $40_1$ through $40_S$, while memory channel $42_R$ may comprise memory devices $40_T$ through $40_M$.

The memory controller 80 is configured to generate a variety of signals including a clock signal (CLK), control signals (ADDR and CMD) and command signals. One or more of the CLK, ADDR and CMD signals may be provided to the RCD 50, e.g., via one or more buses 23.

Signals from the memory controller 80 may also be transmitted from the memory controller 80 to the PMIC 60 via a bus 24, also referred to herein as a host interface bus 24. In some embodiments, host interface bus 24 is bi-directional and is configured to communicate commands or other data between PMIC 60 and memory controller 80 or other components of the memory module 20. The host interface bus 24 may implement an I²C protocol, an I³C protocol or any other protocol.

A data bus 72 may be connected between the memory controller 80 and the data paths 22, e.g., with data buffers 30, and may comprise connectors 70, e.g., traces, pins and other connections, between the memory controller 80 and the data paths 22.

The memory controller 80 may generate or receive data signals, e.g., DQa-DQn, and data strobe signals, e.g., DQSa-DQSn, that may be presented to or received from the data bus 72. Portions of the signals DQa-DQn and DQSa-DQSn may be presented to or received from respective data paths 22. In the example shown, each of the signals DQa-DQn may have a corresponding signal DQSa-DQSn. In some embodiments, one DQS signal may strobe multiple DQ signals, e.g., one DQS signal for four DQ signals in some embodiments.

The RCD 50 is configured to communicate with the memory controller 80, the data buffers 30, the memory channels 42 and the PMIC 60. The RCD 50 is configured to decode instructions, e.g., control words, received from the memory controller 80. For example, the RCD 50 may be configured to receive and decode register command words (RCWs). In another example, the RCD 50 may be configured to receive and decode buffer control words (BCWs). The RCD 50 is configured to train one or more of the data buffers 30, memory devices 40 and the command and address lines between the RCD 50 and the memory controller 80. For example, the RCWs may flow from the memory controller 80 to the RCD 50 and be used to configure the RCD 50.

In some embodiments, the RCD 50 may implement a command/address register, e.g., a 32-bit 1:2 command/address register. The RCD 50 may support an at-speed bus, e.g., a unidirectional buffer communications (BCOM) bus between the RCD 50 and the data buffers 30. In some embodiments, the RCD 50 may implement one or more of automatic impedance calibration, command/address parity checking, control register RCW readback, a serial bus such as, e.g., a 1 MHz inter-integrated circuit ($I^2C$) bus, and a 12.5 MHz inter-integrated circuit ($I^3C$) bus. Inputs to the RCD 50 may be pseudo-differential using one or more of external and internal voltages. The clock outputs, command/address outputs, control outputs and data buffer control outputs of the RCD 50 may be enabled in groups and independently driven with different strengths.

The RCD 50 is configured to receive the CLK, ADDR and CMD signals or other signals such as, e.g., RCWs and BCWs, from the memory controller 80 and to utilize various digital logic components to generate corresponding output signals based on the CLK, ADDR and CMD signals. For example, the RCD 50 is configured to generate corresponding signals such as, e.g., CLK', ADDR' and CMD' signals based on the received CLK, ADDR and CMD signals. The CLK', ADDR' and CMD' signals may be presented to the memory channels 42. For example, the CLK' signals may be transmitted from the RCD 50 to the memory channels 42 on a common bus 25 and the ADDR' and CMD' signals may be transmitted from the RCD 50 to the memory channels 42 on a common bus 26. The RCD 50 is also configured to generate one or more data buffer control (DBC) signals that are transmitted to the data buffers 30, for example, on a common bus 27, also referred to herein as a data buffer control bus 27.

The data buffers 30 are configured to receive commands and data from the data buffer control bus 27 and to generate data, receive data or transmit data to and from the data bus 72. Each data path 22 also comprises bus 28 between its data buffer 30 and memory channel 42 that is configured to carry the data between the data buffer 30 and memory channel 42. For example, as seen in FIG. 2, data path $22_1$ comprises a bus 28 between data buffer $30_1$ and memory channel $42_1$.

The data buffers 30 are configured to buffer data on the buses 72 and 28 for write operations, e.g., data transfers from the memory controller 80 to the corresponding memory channels 42, and read operations, e.g., data transfers from the corresponding memory channels 42 to the memory controller 80.

In some example embodiments, the data buffers 30 exchange data with the memory devices 40 via the buses 28 in small units, e.g., 4-bit nibbles. In other embodiments, larger or smaller sizes of data transfer may alternatively be utilized. In some cases, the memory devices 40 may be arranged into multiple sets, e.g., two sets. For example, for a two set/two memory device implementation, e.g., memory devices $40_1$ and $40_2$, each set may contain a single memory device 40, e.g., $40_1$ or $40_2$) with each memory device 40 being connected to the respective data buffers 30 through an upper nibble and a lower nibble. For two set/four memory device implementation, each set may contain two memory devices 40. The first set may be connected to the respective data buffers 30 through the upper nibble and the second set may be connected to the respective data buffers 30 through the lower nibble. For two set/eight memory device implementation, each set may contain four of the memory devices 40. The first set of four memory devices 40 may connect to the respective data buffers 30 through the upper nibble and the second set of four memory devices may connect to the respective data buffers 30 through the lower nibble. Other numbers of sets, other numbers of memory devices per set and other data unit sizes may alternatively be utilized.

Memory module 20 may also comprise an interface 29 that is configured to enable communication between the RCD 50 and the PMIC 60. For example, the interface 29 may utilized as part of a register clock driver/power management integrated circuit interface, e.g., an RCD-PMIC interface. The interface 29 is configured to support one or more signals or connections that may be bidirectional or unidirectional.

Illustrative embodiments will now be described with reference to FIGS. 1-7.

Figure 3:
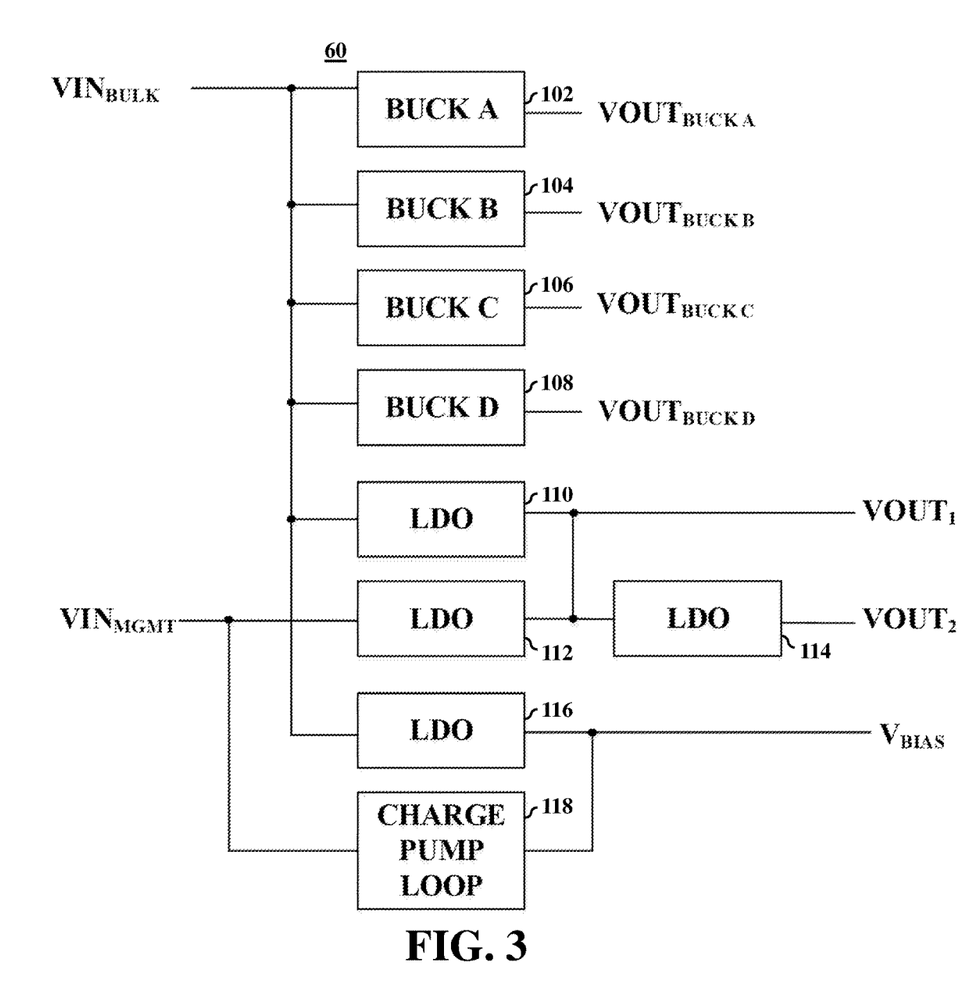
FIG. 3 is a block diagram of an example power management integrated circuit (PMIC) of the memory module of FIG. 2 according to an embodiment of the disclosure.

Power management in a DDR memory module is performed by a highly integrated, highly efficient PMIC 60 with programmable and precise output voltage power solutions. In some embodiments, the PMIC 60 is powered from two input power supplies, e.g., a management power supply $VIN_{MGMT}$ and a bulk power supply $VIN_{BULK}$ although other power supplies may also be present. In some embodiments, PMIC 60 may comprise a plurality of pins, e.g., 36 pins or another number of pins, that connect to the memory module 20 where $VIN_{MGMT}$ and $VIN_{BULK}$ each receive power from one or more of the pins. For example, $VIN_{BULK}$ may receive power from the memory module 20 via four pins and $VIN_{MGMT}$ may receive power from the memory module 20 via one pin. In other embodiments, a different number of pins may supply power to $VIN_{MGMT}$ and $VIN_{BULK}$. One or more of the pins may correspond to one or more of the connectors 70 where, for example, the power supplied to the PMIC 60 for one or both of $VIN_{MGMT}$ and $VIN_{BULK}$ may be received from the circuit 90 of the computing device such as, e.g., a motherboard, main board or other component of the computing device that communicates with the memory module 20.

In some embodiments, PMIC 60 receives a $VIN_{MGMT}$ having a voltage of about 3.3V and receives a $VIN_{BULK}$ having a voltage range of about 4.25V to about 15V from the memory module 20. For example, the voltage of $VIN_{BULK}$ may vary based on the required load for the PMIC 60 at any given time. Other voltage values or ranges for $VIN_{MGMT}$ and $VIN_{BULK}$ may alternatively be used.

PMIC 60 comprises a plurality of voltage regulation modules (VRMs) 102 through 116. The VRMs 102 through 116 are configured to provide regulated output voltages for the various components of the memory module 20. The PMIC 60 is configured to manage, maintain and adjust the output voltages where, for example, the PMIC 60 may perform adjustments or modifications to the output voltages based on instructions received from the RCD 50 or the memory controller 80.

As illustrated in FIG. 3, for example, VRMs 102 through 108 comprise DC-DC converters such as, e.g., buck converters, which are utilized to step down the voltage of $VIN_{BULK}$ to corresponding output voltages $VOUT_{BUCK\_A}$, $VOUT_{BUCK\_B}$, $VOUT_{BUCK\_C}$ and $VOUT_{BUCK\_D}$. For example, VRM 102 may output a stepped down output voltage $VOUT_{BUCK\_A}$ of about 1.0V, sometimes referred to as a $V_{DD}$ supply rail, VRM 104 may output a stepped down output voltage $VOUT_{BUCK\_B}$ of about 1.0V, also sometimes referred to as a $V_{DD}$ supply rail, VRM 106 may output a stepped down output voltage $VOUT_{BUCK\_C}$ of about 1.1V, sometimes referred to as a $V_{DDQ}$ supply rail, and VRM 108 may output a stepped down output voltage $VOUT_{BUCK\_D}$ of about 1.8V, sometimes referred to as a $V_{pp}$ supply rail. VRMs 102 through 108 may also be referred to herein as bucks A through D. While described and illustrated as buck converters, VRMs 102 through 108 may alternatively comprise other types of VRMs. In addition, while described above as outputting particular voltage values, VRMs 102 through 108 may alternatively be configured to output other voltage values, for example, as required by the various components of the memory module 20.

VRMs 110 through 116 comprise LDOs that are configured to convert the voltages of $VIN_{BULK}$ and $VIN_{MGMT}$ into continuously controlled, steady, low-noise DC output voltages. For example, VRM 110 is configured to convert $VIN_{BULK}$ into an output voltage $VOUT_1$ of about 1.8V, VRM 112 is configured to convert $VIN_{MGMT}$ into the output voltage $VOUT_1$, VRM 114 is downstream of VRMs 110 and 112 and is configured to convert $VOUT_1$ into an output voltage $VOUT_2$ of about 1.0V and VRM 116 is configured to convert $VIN_{BULK}$ into an output voltage $V_{BIAS}$ of about 5.0V. As seen in FIG. 3, VRMs 110 and 112 work together to maintain or output the voltage $VOUT_1$ and VRM 116 works together with a charge pump loop 118 to maintain or output the voltage $V_{BIAS}$.

While VRMs 102 through 116 are described above as comprising components such as, e.g., buck converters and LDOs, in other embodiments alternative circuitry may be utilized to perform the voltage regulation functions. Similarly, while VRMs 102 through 116 are described above as outputting particular voltages, in other embodiments alternative voltages may be output depending on the requirements of the memory module 20.

Charge pump loop 118 comprises, for example, a switched capacitor voltage converter or another converter that is configured to adjust its output voltage to maintain $V_{BIAS}$ at or about a target voltage, e.g., 5V. For example, the outputs of VRM 116 and charge pump loop 118 may combine and compensate each other to help PMIC 60 save power and gain efficiency benefits. In some embodiments, which one of VRM 116 and charge pump loop 118 outputs $V_{BIAS}$ may be switched depending on which one provides the best conversion efficiency.

Figure 4:
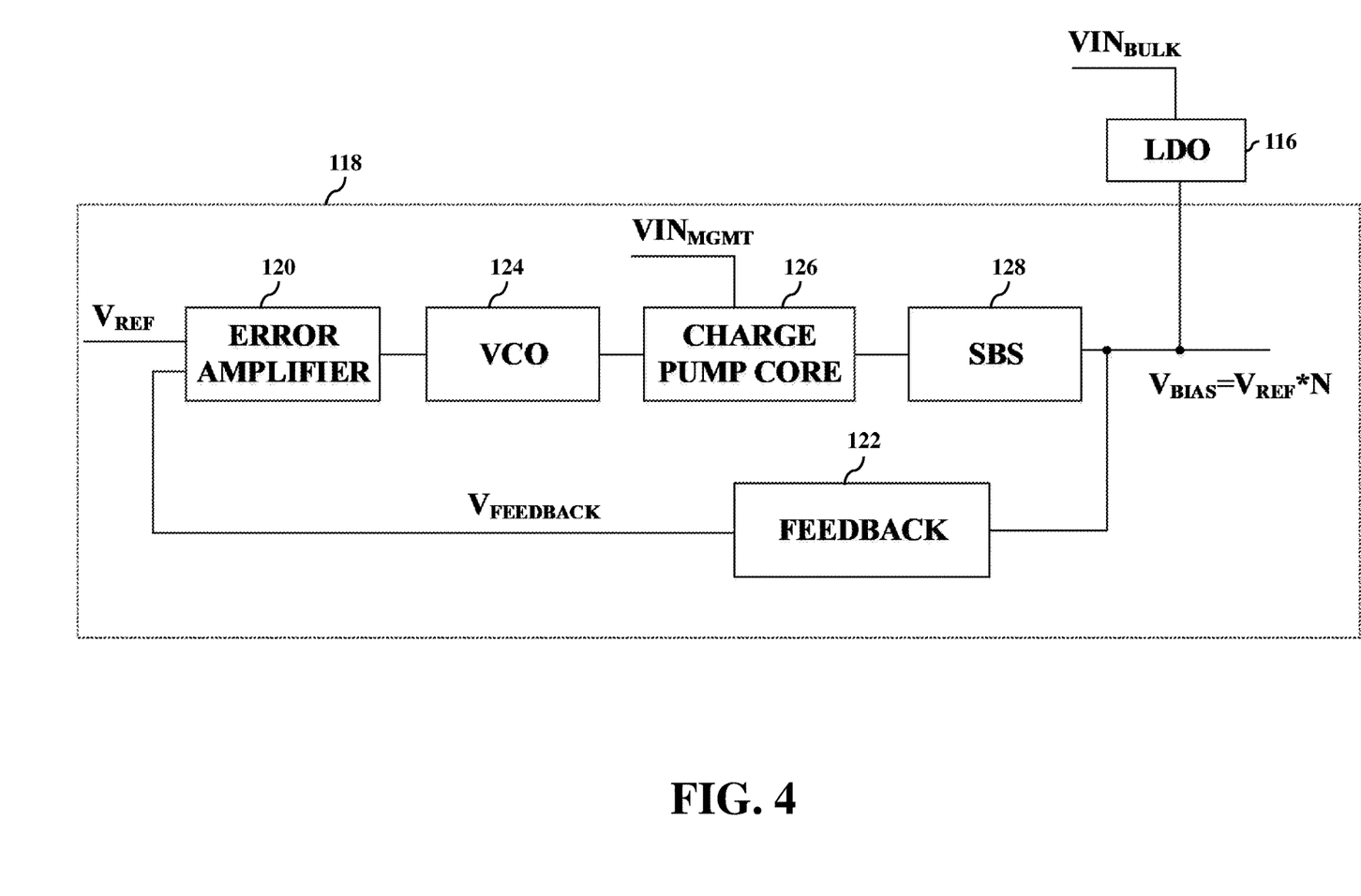
FIG. 4 is a block diagram of an example charge pump loop of the PMIC of FIG. 3 according to an embodiment of the disclosure.

With reference now to FIG. 4, an example implementation of charge pump loop 118 is illustrated. In the charge pump loop 118, an error amplifier 120 receives a reference voltage $V_{REF}$ and an output $V_{FEEDBACK}$ from a feedback circuit 122 as inputs. The feedback circuit 122 comprises a resistor divider or other component that adjusts the $V_{BIAS}$ voltage for use by the error amplifier 120. For example, the feedback circuit 122 may divide $V_{BIAS}$ by a constant value N ($V_{BIAS}/N$) to output an adjusted voltage $V_{FEEDBACK}$ which is used as an input for error amplifier 120. In other embodiments, other values or mathematical operations may be performed on $V_{BIAS}$ by feedback circuit 122 to generate $V_{FEEDBACK}$.

In an example embodiment, $V_{FEEDBACK}$ is compared to $V_{REF}$ by error amplifier 120. When $V_{FEEDBACK}$ has a smaller voltage than $V_{REF}$, the error amplifier 120 will drive a voltage-controlled oscillator (VCO) 124 to output a higher frequency value. For example, as the difference between $V_{FEEDBACK}$ and $V_{REF}$ increases, the frequency output by VCO 124 will also increase. Increasing the frequency output by VCO 124 drives a charge pump core 126 to deliver more charge to an on-board-capacitor $CP_{BOARD}$ (FIG. 5) via a self-bias switch (SBS) 128 in addition to supplying a load on $V_{BIAS}$ and increasing $V_{BIAS}$.

When $V_{FEEDBACK}$ has a larger voltage than $V_{REF}$, the error amplifier 120 will drive VCO 124 to output a lower frequency value. For example, as the difference between $V_{FEEDBACK}$ and $V_{REF}$ increases, the frequency output by VCO 124 will decrease. A lower frequency output by VCO 124 drives the charge pump core 126 to deliver less charge to $CP_{BOARD}$ via SBS 128 in addition to supplying a load on $V_{BIAS}$ and decreasing $V_{BIAS}$.

When $V_{FEEDBACK}$ is equal to $V_{REF}$, VCO 124 outputs a stable frequency and $V_{BIAS}$ is settled at $V_{REF}*N$. For example, $V_{BIAS}$ may settle at 5V in some embodiments.

Figure 5:
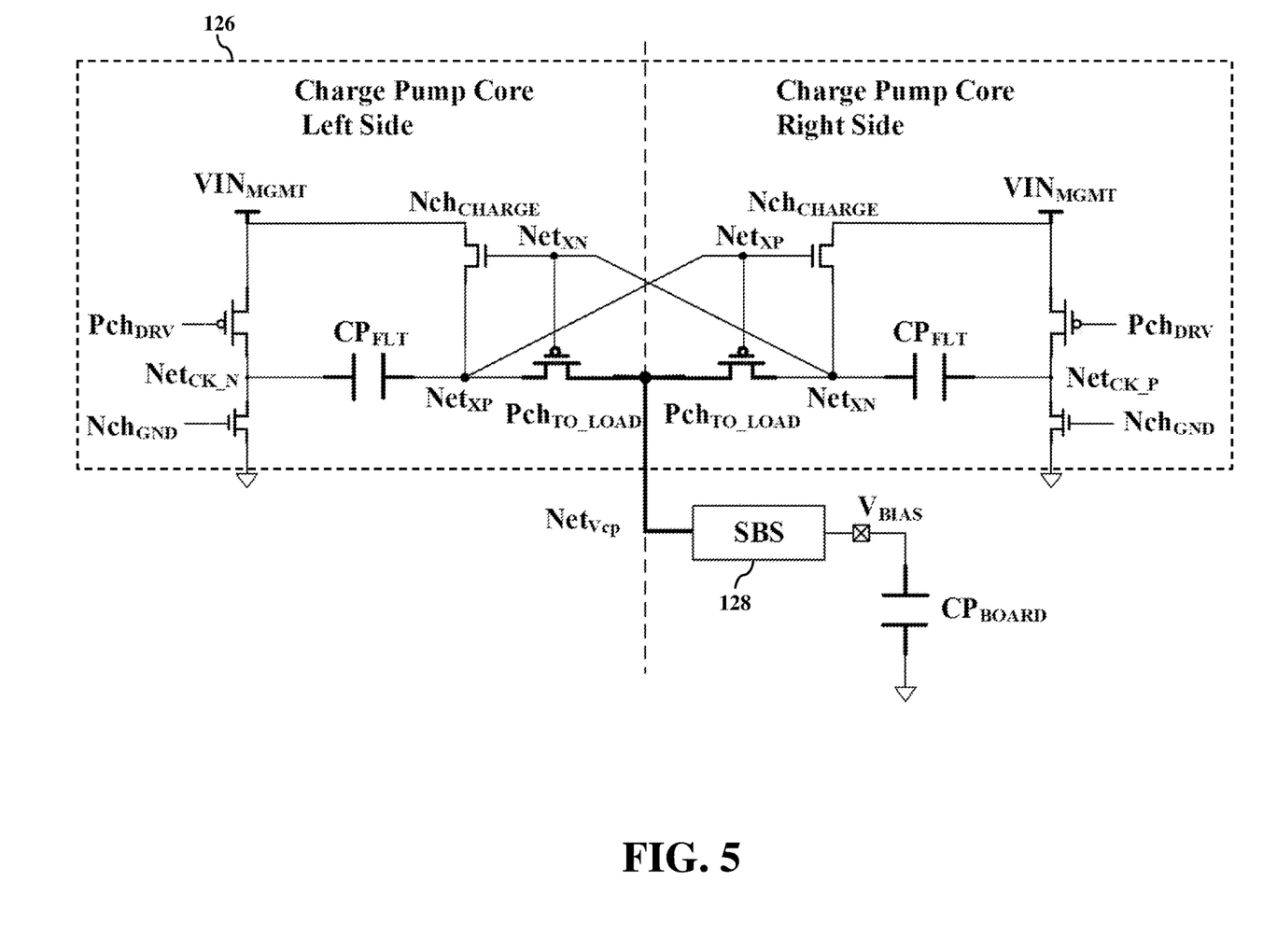
FIG. 5 is a circuit diagram of a charge pump core of the charge pump loop of FIG. 4 according to an embodiment of the disclosure.

With reference now to FIG. 5, the charge pump core 126 is illustrated in more detail. In some embodiments, charge pump core 126 comprises a switched capacitor voltage converter having two sides, a left side and a right side. Each side of the charge pump core 126 has two phases, a charge phase and a pump phase, and comprises a variety of components including n channel transistors $Nch_{CHARGE}$ and $Nch_{GND}$, e.g., high side FETs, p channel transistors $Pch_{DRV}$ and $PCh_{TO\_LOAD}$, e.g., low side FETs, and a capacitor $CP_{FLT}$.

During the charge phase for a given side, the capacitor $CP_{FLT}$ is connected between $VIN_{MGMT}$ and ground (GND) through transistors $Nch_{CHARGE}$ and $Nch_{GND}$. This allows the capacitor $CP_{FLT}$ to be charged to the voltage of $VIN_{MGMT}$, e.g., 3.3V.

During the pump phase for a given side, $CP_{FLT}$ is connected between $VIN_{MGMT}$ and $Net_{Vcp}$ through transistors $Pch_{DRV}$ and $Pch_{TO\_LOAD}$ to discharge the capacitor $CP_{FLT}$. The amount of charge, $(2VIN_{MGMT}-V_{BIAS})*CP_{FLT}$, is pumped to the capacitor $CP_{BOARD}$ and drained by the load during a half clock cycle to maintain the voltage of $V_{BIAS}$ at around the target value, e.g., 5V in this embodiment as shown by the waveform in FIG. 6 for $Net_{Vcp}$.

The left and right sides of the charge pump core 126 take turns performing the charge and pump phases. For example, as can be seen in FIG. 5, when the left side of the charge pump core 126 is charging, $Net_{XP}$ is set equal to $VIN_{MGMT}$ which turns off the transistor $Nch_{CHARGE}$ of the right side but also turns on the transistor $Pch_{TO\_LOAD}$ of the right side to allow the right side to discharge its capacitor $CP_{FLT}$ to $Net_{Vcp}$ and settle the $V_{BIAS}$, e.g., at 5V. Similarly, when the right side of the charge pump core 126 is charging, $Net_{XN}$ is set equal to $VIN_{MGMT}$ which turns off the transistor $Nch_{CHARGE}$ of the left side but also turns on the transistor $Pch_{TO\_LOAD}$ of the left side to allow the left side to discharge its capacitor $CP_{FLT}$ to $Net_{Vcp}$ and settle the $V_{BIAS}$, e.g., to 5 V.

The switching between charge and pump phases for the sides of the charge pump core 126 are controlled by the output frequency of the VCO 124. For example, as the frequency output by VCO 124 increases, the rate of switching between charging and discharging for the left and right sides also increases. Likewise, as the frequency output by VCO 124 decreases, the rate of switching between charging and discharging for the left and right sides decreases. In illustrative embodiments, the capacitor $CP_{FLT}$ on each side of the charge pump core 126 is fully charged or discharges during each phase. In other embodiments, for example, the frequency output by VCO 124 may be greater than a threshold value at which the $CP_{FLT}$ may not fully charge or discharge during each phase, e.g., the frequency is so high that the phases switch before a full charge or discharge of the $CP_{FLT}$ can occur. In some embodiments, the frequency output range of the VCO 124 may be controlled such that the capacitors $CP_{FLT}$ will fully discharge or charge before switching phases, e.g., by inhibiting the maximum frequency output by VCO 124 from limiting the maximum output current of the charge pump core 126.

The charging cycles of the charge pump core 126 may follow equations (1) and (2) below:

$$V_{BIAS} = V_{REF} * N \quad (1)$$

$$(2 VIN_{MGMT} - V_{BIAS}) * CP_{FLT} = I\text{load} * T * 0.5 \quad (2)$$

N is a coefficient that may be determined and set based on the target voltage for $V_{BIAS}$ and the value of the reference voltage $V_{REF}$. For example, if the target voltage for $V_{BIAS}$ is 5V and the reference voltage $V_{REF}$ is 1.8V, N is equal to about 2.777. In other embodiments, if $V_{REF}$ is equal to 1V, N may be equal to 5. Any other value for N may be utilized based on the target voltage for $V_{BIAS}$ and the reference voltage $V_{REF}$.

From $VIN_{MGMT}$ to $V_{BIAS}$, the theory efficiency of charge pump loop 118 is about 76%, e.g., $V_{BIAS}/VIN_{MGMT}/2$. From $VIN_{BULK}$ to $V_{BIAS}$, the theory efficiency of VRM 116, e.g., an LDO, is about 42%, e.g., $V_{BIAS}/VIN_{BULK}$, assuming $VIN_{BULK}$ is equal to 12V. By utilizing a charge pump to complement and assist the VRM 116 in maintaining $V_{BIAS}$ at the target voltage, e.g., 5V, greater efficiency in the PMIC 60 may be achieved over just using an LDO or other VRM to output $V_{BIAS}$ This is because the efficiency to step down the voltage of a 12V $VIN_{BULK}$ power supply to 5V may be much worse than the efficiency to step up the voltage of the 3.3V $VIN_{MGMT}$ power supply to 5V.

As an example, if the load on the memory module 20 is light, $VIN_{BULK}$ may be set to 5V such that maintaining the $V_{BIAS}$ using the VRM 116 may be highly efficient, e.g., have a high theory efficiency. In such a case, the charge pump core 126 may be disabled, e.g., by turning off the SBS 128. However, as the load on the memory module 20 increases, the voltage of $VIN_{BULK}$ will also increase which results in greater efficiency losses in the VRM 116 when converting from $VIN_{BULK}$ and $V_{BIAS}$ For example, where little to no efficiency loss may occur when the $VIN_{BULK}$ has a voltage of 5V, when $VIN_{BULK}$ increases to 12V due to increased load requirements, the efficiency loss converting from 12V to 5V using the VRM 116 may be significant, e.g., a theory efficiency of 42% as mentioned above. To improve the efficiency in maintaining $V_{BIAS}$ at the target voltage in such a case, VRM 116 may be turned off and charge pump core 126 may be turned on, e.g., by turning on SBS 128. In some embodiments, both the VRM 116 and the charge pump core 126 may be turned on at the same time where, for example, the charge pump core 126 may assist the VRM 116 in maintaining the target voltage of $V_{BIAS}$ thereby reducing the efficiency loss in the conversion from $VIN_{BULK}$ to $V_{BIAS}$.

Figure 6:
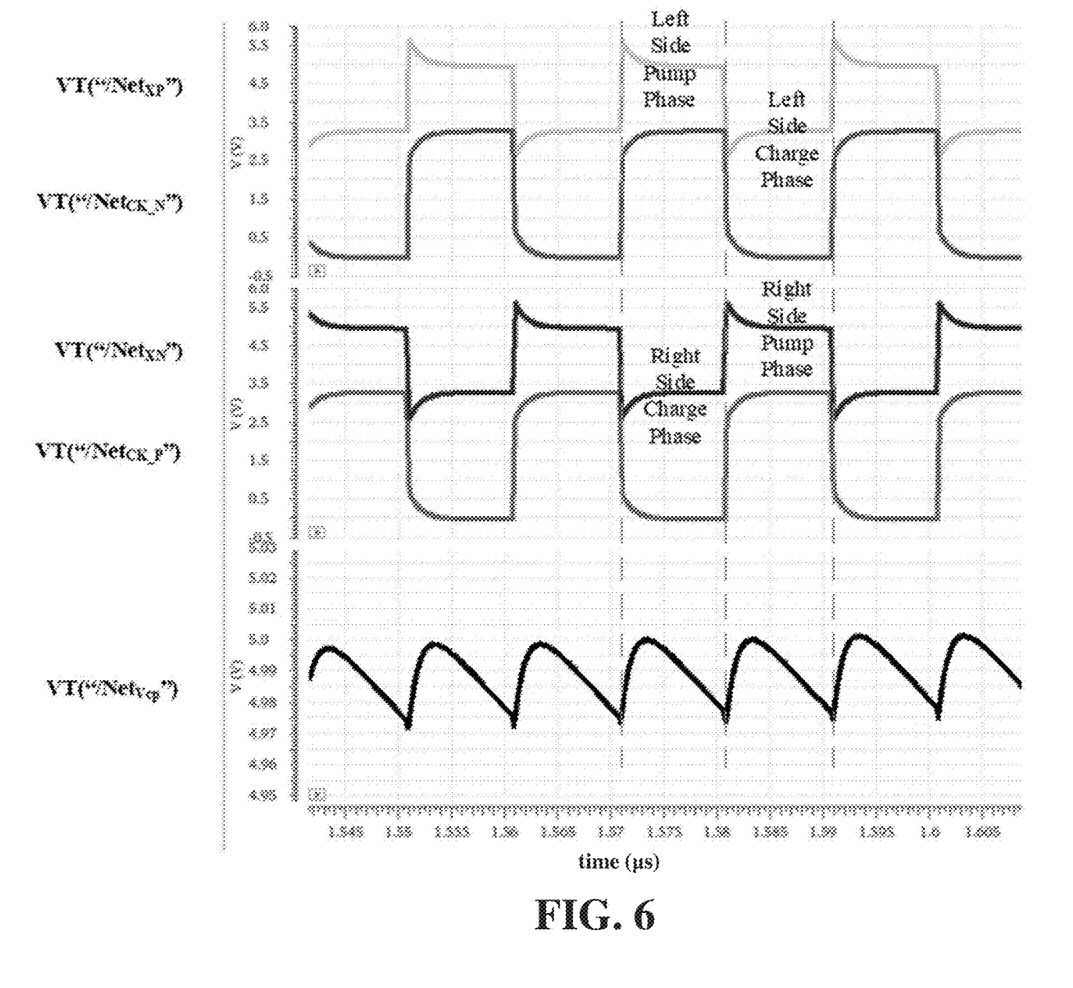
FIG. 6 is a graph of example voltage waveforms output by components of the charge pump core of FIG. 5 according to an embodiment of the disclosure.

With reference to FIG. 6, waveforms for the voltage nodes $Net_{XP}$, $Net_{CK\_N}$, $Net_{XN}$, $Net_{CK\_P}$ and $Net_{Vcp}$ of the charge pump core 126 of FIG. 5 during the pump and charge phases are illustrated. When the left side of charge pump core 126 is on a pump phase, $Net_{XP}$ increases its voltage due to the discharge of the left side capacitor $CP_{FLT}$ and then dumps the charge to the capacitor $CP_{BOARD}$ before settling at the voltage of $V_{BIAS}$, e.g., 5V. The voltage node $Net_{CK\_N}$ is connected to $VIN_{MGMT}$ through the left side $Pch_{DR}y$ and helps $Net_{XP}$ increase by providing potential to the back side of the left side $CP_{FLT}$ and then settles at the voltage of $VIN_{MGMT}$, e.g., 3.3V.

At the same time, the right side of charge pump core 126 is on the charge phase. $Net_{XN}$ is connected to $VIN_{MGMT}$ through the right side $Nch_{CHARGE}$ and $Net_{CK\_P}$ is connected to the GND through right side $Nch_{GND}$. The right side $CP_{FLT}$ is charged to $VIN_{MGMT}$.

Since the clock frequency output by VCO 124 drives the charge phase and pump phase switching, the left side of the charge pump core 126 will be on the charge phase during the next part of the clock cycle and the right side of the charge pump core 126 will be on pump phase. As can be seen in FIG. 6, the waveform for $Net_{Vcp}$ shows a small ripple on $V_{BIAS}$ around the target of 5V, e.g., fluctuating near 5V, which is related to the ratio of $CP_{FLT}/CP_{BOARD}$.

Figure 7:
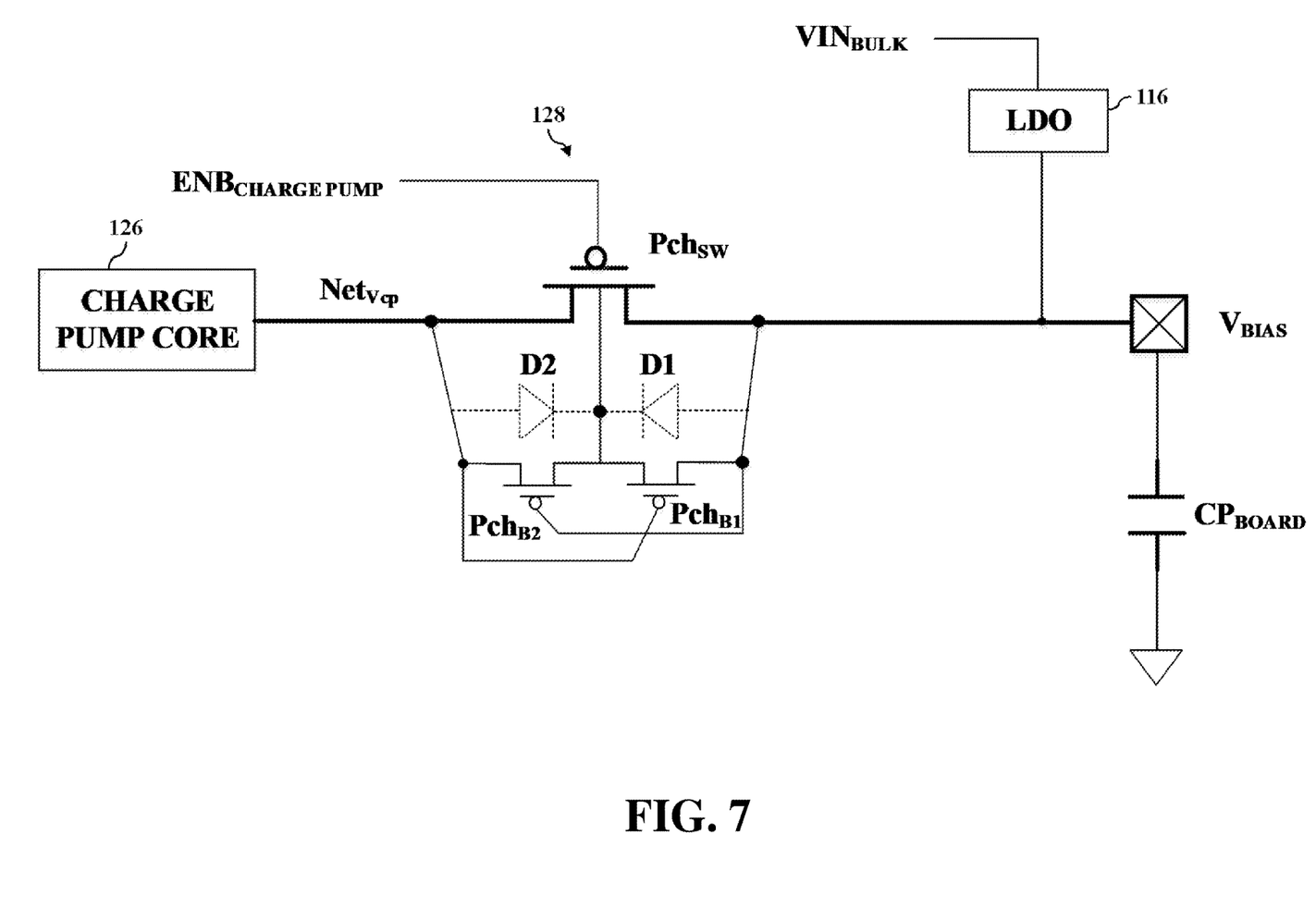
FIG. 7 is a circuit diagram of a self-biased switch of the charge pump loop of FIG. 4 according to an embodiment of the disclosure.

With reference now to FIG. 7, the SBS 128 combines the output $Net_{Vcp}$, of charge pump core 126 with the output of VRM 116 to generate $V_{BIAS}$. $Pch_{SW}$ is a transistor switch that connects $Net_{Vcp}$ with the stepped down output of VRM 116 from $VIN_{BULK}$. The nwell of $Pch_{SW}$ is biased by transistors $Pch_{B1}$ or $Pch_{B2}$. For example, when $Pch_{SW}$ is turned on, both $Pch_{B1}$ and $Pch_{B2}$ are turned off and the nwell of $Pch_{SW}$ is biased through parasitic diodes D1 and D2. The SBS 128 inhibits the parasitic path of the diodes D1 and D2 between $Net_{Vcp}$ and the output of VRM 116. For example, when VRM 116 is turned off, its output has a high impedance and $V_{BIAS}$ is driven by $Net_{Vcp}$. When the charge pump core 126 is turned off, e.g., by turning off $Pch_{SW}$, the output of SBS 128 has a high impedance with $V_{BIAS}$ and head-to-head diodes D1 and D2 inhibit the parasitic current path from $V_{BIAS}$ to $VIN_{MGMT}$, e.g., via charge pump core 126.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The invention claimed is:

1. An apparatus comprising:
   a power management integrated circuit comprising:
   a voltage regulator supplied by a first power source and configured to generate a first output;
   a charge pump supplied by a second power source and configured to generate a second output, a bias voltage output of the power management integrated circuit being generated based at least in part on the first output and the second output, the charge pump being configured to adjust the second output based at least in part on a comparison between the bias voltage output and a reference voltage; and
   a self-biased switch disposed between the output of the charge pump and the output of the voltage regulator, the self-biased switch being configured to switch between outputting the second output and having a high output impedance.

2. The apparatus of claim 1, wherein the second power source has a smaller voltage than the first power source.

3. The apparatus of claim 1, wherein the first power source is a variable voltage power source and the second power source is a static voltage power source.

4. The apparatus of claim 1, wherein the voltage regulator comprises a low dropout voltage regulator.

5. The apparatus of claim 1, wherein the charge pump comprises a switched capacitor voltage converter.

6. The apparatus of claim 5, wherein the charge pump comprises:
   a first side comprising a first capacitor, the first side being configured to alternate between charging and discharging the first capacitor based at least in part on a clock signal; and
   a second side comprising a second capacitor, the second side being configured to alternate between charging and discharging the second capacitor based at least in part on the clock signal.

7. The apparatus of claim 6, wherein the first side is configured to charge the first capacitor while the second side discharges the second capacitor.

8. The apparatus of claim 6, wherein the frequency of the clock signal is determined based at least in part on the comparison between the bias voltage output and the reference voltage.

9. The apparatus of claim 6, wherein the frequency of the clock signal is limited to a range that is configured to alternately fully charge and fully discharge the first and second capacitors.

10. The apparatus of claim 1, wherein the self-biased switch comprises a n-well that is biased by a pair of head-to-head diodes.

11. A memory module comprising:
    a power management integrated circuit supplied by a first power source and a second power source and configured to output a bias voltage output, the power management integrated circuit comprising:
    a charge pump supplied by the second power source and configured to generate a charge pump voltage output, the bias voltage output of the power management integrated circuit being generated based at least in part on the charge pump voltage output, the charge pump being configured to adjust the charge pump voltage output based at least in part on a comparison between the bias voltage output and a reference voltage; and
    a self-biased switch disposed between the output of the charge pump and the output of the voltage regulator, the self-biased switch being configured to switch between outputting the charge pump voltage output and having a high output impedance.

12. The memory module of claim 11, wherein the second power source has a smaller voltage than the first power source.

13. The memory module of claim 11, wherein the first power source is a variable voltage power source and the second power source is a static voltage power source.

14. The memory module of claim 11, wherein the charge pump comprises a switched capacitor voltage converter.

15. The memory module of claim 14, wherein the charge pump comprises:
    a first side comprising a first capacitor, the first side being configured to alternate between charging and discharging the first capacitor based at least in part on a clock signal; and
    a second side comprising a second capacitor, the second side being configured to alternate between charging and discharging the second capacitor based at least in part on the clock signal.

16. The memory module of claim 15, wherein the first side is configured to charge the first capacitor while the second side discharges the second capacitor.

17. The memory module of claim 15, wherein the frequency of the clock signal is determined based at least in part on the comparison between the bias voltage output and the reference voltage.

18. The memory module of claim 15, wherein the frequency of the clock signal is limited to a range that is configured to alternately fully charge and fully discharge the first and second capacitors.

19. An apparatus comprising:
    a first capacitor that is configured to alternately charge from a power source based at least in part on a first portion of a clock signal and to discharge to a bias voltage output of a power management integrated circuit based at least in part on a second portion of the clock signal;
    a second capacitor that is configured to alternately charge from the power source based at least in part on the second portion of the clock signal and to discharge to the bias voltage output of the power management integrated circuit based at least in part on the second portion of the clock signal; and
    a self-biased switch disposed between the output of the charge pump and the output of the voltage regulator, the self-biased switch being configured to switch between outputting the second output and having a high output impedance.

* * * * *